US012700472B2

(12) United States Patent
Kanter et al.

(10) Patent No.: US 12,700,472 B2
(45) Date of Patent: Aug. 4, 2026

(54) RANDOM READ TRACKING IN NON-VOLATILE MEMORY DEVICES

(71) Applicant: Kioxia Corporation, Tokyo (JP)

(72) Inventors: Ofir Kanter, Haifa (IL); Eyal Nitzan, Tel Aviv (IL); Avi Steiner, Tel Aviv (IL); Yasuhiko Kurosawa, Kanagawa (JP); Hanan Weingarten, Tel Aviv (IL)

(73) Assignee: KIOXIA CORPORATION, Tokyo (JP)

( * ) Notice: Subject to any disclaimer, the term of this patent is extended or adjusted under 35 U.S.C. 154(b) by 133 days.

(21) Appl. No.: 18/618,429

(22) Filed: Mar. 27, 2024

(65) Prior Publication Data

US 2025/0308614 A1      Oct. 2, 2025

(51) Int. Cl.
*G11C 29/44* (2006.01)
*G11C 29/42* (2006.01)
*G11C 29/50* (2006.01)

(52) U.S. Cl.
CPC .............. *G11C 29/44* (2013.01); *G11C 29/42* (2013.01); *G11C 29/50004* (2013.01)

(58) Field of Classification Search
CPC .............. G11C 29/44; G11C 29/50004; G11C 2029/0409; G11C 29/021; G11C 29/028; G11C 29/42; G11C 29/52
See application file for complete search history.

(56) References Cited

U.S. PATENT DOCUMENTS

| | | | | |
|---|---|---|---|---|
| 11,934,688 | B2 * | 3/2024 | Eisenhuth | .............. G06F 3/0655 |
| 2012/0008414 | A1 * | 1/2012 | Katz | ...................... G11C 16/26 |
| | | | | 365/185.24 |
| 2020/0286551 | A1 * | 9/2020 | Sheperek | ............ G11C 11/5642 |
| 2021/0223974 | A1 * | 7/2021 | Zhang | ...................... G06F 3/061 |
| 2022/0206905 | A1 * | 6/2022 | Milton | .................. G06F 11/076 |
| 2023/0134545 | A1 * | 5/2023 | Eliash | ................... G06F 3/0604 |
| | | | | 711/154 |
| 2024/0319875 | A1 * | 9/2024 | Kanter | ................ G06F 11/1048 |
| 2025/0308614 | A1 * | 10/2025 | Kanter | ................... G11C 29/44 |

OTHER PUBLICATIONS

H. Zhou, A. Jiang and J. Bruck, "Error-correcting schemes with dynamic thresholds in nonvolatile memories," 2011 IEEE International Symposium on Information Theory Proceedings, St. Petersburg, Russia, 2011, pp. 2143-2147 (Year: 2011).*

* cited by examiner

*Primary Examiner* — Cynthia Britt
(74) *Attorney, Agent, or Firm* — FOLEY & LARDNER LLP

(57) ABSTRACT

The present disclosure relates to systems, apparatuses, methods, and non-transitory computer-readable media including a non-volatile memory and a controller operatively coupled to the non-volatile memory. The controller is to determine information on a number of errors for a page for reading data stored in the page of the non-volatile memory, and the data is read using a first read threshold. The controller is to determine a second read threshold based at least in part on the first read threshold and the number of page errors for the page and apply the second read threshold for subsequently reading data stored on the page according to a decision rule.

20 Claims, 7 Drawing Sheets

RANDOM READ TRACKING IN NON-VOLATILE MEMORY DEVICES

TECHNICAL FIELD

The present disclosure relates generally to systems and methods for random read tracking in non-volatile memory devices.

BACKGROUND

As non-volatile memory (e.g., NAND, flash memory, etc.) technology evolves, performance requirements are becoming increasingly challenging. Typically, the performance of a non-volatile memory is measured using metrics such as Input/Output Operations Per Second (IOPS) and throughput (e.g., in MiB/sec). For random reads (random read operations), performance is typically measured using IOPS, and thus, the goal has conventionally been to improve the IOPS performance as much as possible.

SUMMARY

At least one aspect is directed to a system including a non-volatile memory and a controller operatively coupled to the non-volatile memory. The controller is to determine information on a number of errors for a page for reading data stored in the page of the non-volatile memory, and the data is read using a first read threshold. The controller is to determine a second read threshold based at least in part on the first read threshold and the number of page errors for the page and apply the second read threshold for subsequently reading data stored on the page according to a decision rule.

At least one aspect is directed to a method that includes determining information on a number of errors for a page for reading data stored in the page of the non-volatile memory, the data is read using a first read threshold, determining a second read threshold based at least in part on the first read threshold and the number of page errors for the page, and applying the second read threshold for subsequently reading data stored on the page according to a decision rule.

At least one aspect is directed to at least one non-transitory computer readable medium including one or more instructions stored thereon and executable by a processor to determine information on a number of errors for a page for reading data stored in the page of the non-volatile memory, the data is read using a first read threshold, determine a second read threshold based at least in part on the first read threshold and the number of page errors for the page, and apply the second read threshold for subsequently reading data stored on the page according to a decision rule.

Figure 1:
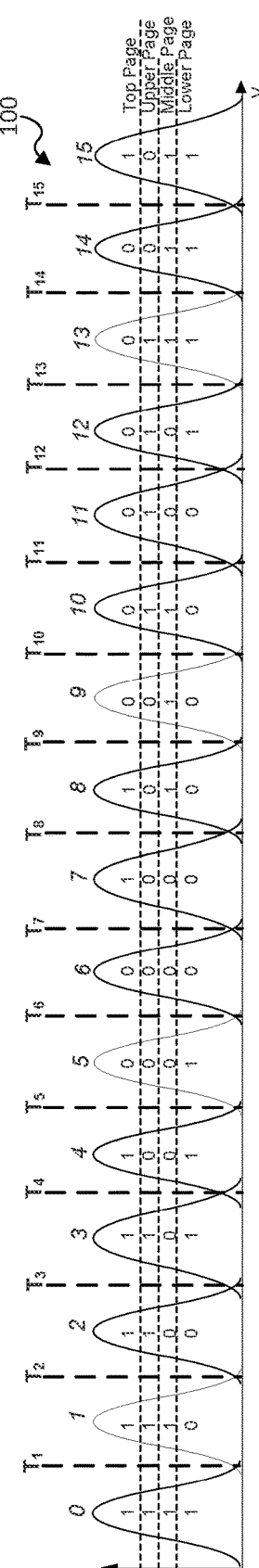
FIG. 1 is a graph illustrating example histograms of Voltage Threshold (VT) distribution, according to various arrangements.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

During NAND block life cycle, the NAND device may be affected by various types of physical phenomena based on the manner in which the NAND device is used. For example, Data Retention (DR) (e.g., storing of information for a specified period) may cause charge leakage over time and can be a dominant source of flash memory errors, mainly in higher lobes of a row voltage threshold distribution. In addition, Read Disturb (RD) refers to reading of a cell that causes nearby cells in a same memory block to change over time or to become programmed. A notorious effect of RD is erase lobe penetration which causes a significant increase of first threshold errors. The first threshold separates the erase lobe from the first lobe in a row voltage threshold distribution.

During device manufacturing, normal read thresholds per block of a non-volatile memory are defined. In the situation in which the block is under stress, these normal thresholds may no longer be adequate and may cause high Bit Error Rate (BER), and in turn, consequently causing decoding failures. Such failures may significantly degrade system performance since read retries must be executed. To mitigate the effects of stresses, such as DR and RD, the most adequate read thresholds should be determined and used in order to reduce the BER as much as possible. Determining the optimal read thresholds can include numerous read operations and may not be practical in actual non-volatile memory devices. However, suboptimal thresholds can be determined using offline optimization and can significantly reduce BER compared to normal thresholds.

Sufficiently reducing the BER leads to reducing or avoiding decoding errors, thus improving system performance of the non-volatile memory device. The arrangements disclosed herein relate to systems, apparatuses, methods, and non-transitory computer-readable media for fast read thresholds tracking in random read operations. In some arrangements, the fast read threshold tracking can be implemented based on Failed Bit Count (FBC) information and operated during a functional read from host or during background read operations. In some examples, FBC is an actual number of page errors per a given page size and in some cases is used instead of or in addition to the BER as performance metric. In some examples, BER is a ratio between the FBC and the page size. In some arrangements, fast read thresholds tracking (or tracking) as described herein has a low computational complexity and can easily be integrated in an existing read flow of a conventional system or a new system including non-volatile memory. Accordingly, system performance during random reads and IOPS of a non-volatile memory under various stress conditions can be improved.

In some examples, fast read thresholds tracking use FBC information from a successful read to identify a stress condition of a target block of the non-volatile memory and change one or more block read thresholds of the target block to allow those block read thresholds to better fit this stress. The stress identification can be based on prior knowledge or predetermined information (e.g., a mapping) regarding physical effect of the stress condition on the read result, including the FBC value and the direction of the errors e.g., erroneously reading "0" as "1" (zero-to-one error) or reading "1" as a "0" (one-to-zero). By efficiently identifying the target block stress condition and properly adjusting its read thresholds (e.g., VTs), Hard Bit (HB) decoding errors can be avoided and system performance can be significantly improved. The relevant signal processing operations can be implemented on a controller (e.g., implemented as a NAND memory controller Hardware (HW) and/or Firmware (FW)), to lend itself to low complexity processing.

In some implementations, stress conditions such as DR and RD can be quickly identified based on known physical effects of such stress and on FBC information. A single page read operation followed by HB decoding (or hard decoding) provides FBC information. This FBC information includes an overall number of errors as well as at least one direction of the errors. The direction of errors refers to mistakenly reading "0" as "1" (a first direction) and mistakenly reading "1" as "0" (a second direction). Higher lobes (states) are more impacted by DR because more electrons are trapped and leak in higher states. Thus, under DR stress, when reading a target page that includes thresholds separating higher states, the resulting directional FBC information can be used to predict states drift and suggest an improved set of read thresholds. These read thresholds can reduce BER for reads in response to future read commands for data stored on the same block.

FIG. 1 is a graph illustrating example histograms 100 of Voltage Threshold (VT) distribution, according to various arrangements. The VT distribution is for a 4 bits per cell (bpc) non-volatile memory device (e.g., flash memory device), e.g., a Quadruple level cells (QLC) with 16 lobes, denoted as 0-15. The depicted 16 lobes (distributions or histograms) corresponding to the 16 different bit combinations of four bits represented by the charge state of the cell. A lower page read uses thresholds T1, T3, T6 and T12 to separate the histograms 100 into those with Least Significant Bits (LSBs) of 0 into those of LSBs of 1. Read thresholds T2, T8, T11, and T13 are used to separate the histograms 100 into those with LSBs of 0 and those with LSBs of 1 for reading middle pages. Read thresholds T4, T10, and T14 are used to separate the histograms 100 into those with LSBs of 0 and those with LSBs of 1 for reading upper pages. Read thresholds T5, T7, T9, and T15 are used to separate the histograms 100 into those with LSBs of 0 and those with LSBs of 1 for reading top pages. The lower most lobe (denoted as 0) is known as the erase level.

Different stress conditions can result in various undesired changes in the VT distribution and increase in BER. In addition, the optimal read thresholds can significantly change due to stresses such as DR and RD. For example, as the DR issue becomes higher, the lobes in the VT distribution can become wider and drift more to the negative voltage direction. The higher states are more impacted by DR since more electrons are trapped and leak in higher states. In RD, as the RD becomes higher, the lobes in the VT distribution can drift more to the positive voltage direction. This can cause the erase lobe 0 to penetrate the first lobe 1 and create a very high BER condition as the RD increases. Such physical behaviors, which are known, can be combined with FBC information (after successful random read and decoding) to identify the stress impacting the target block and decide whether to change to current read thresholds for the block to more accurate read thresholds in future block reads.

Figure 2:
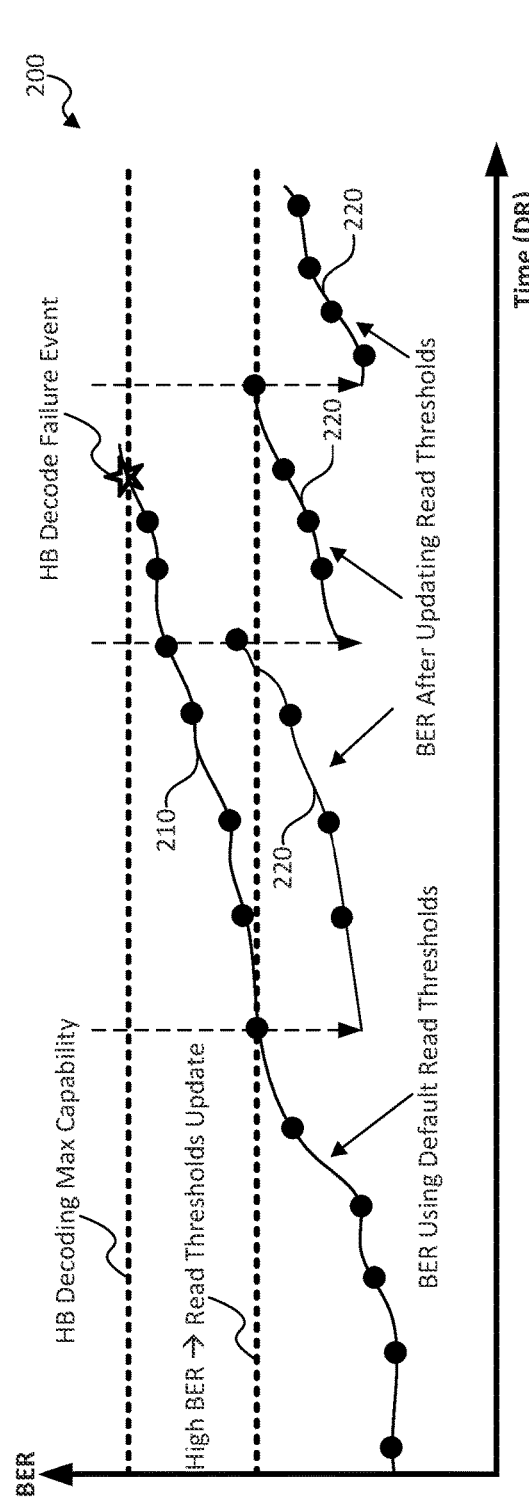
FIG. 2 is a graph illustrating an example result of a fast tracking method that can reduce BER of a non-volatile memory, according to various arrangements.

FIG. 2 is a graph illustrating an example result of a fast tracking method 200 that can reduce BER of a non-volatile memory, according to various arrangements. In FIG. 2, the BER 210 of a NAND block of the non-volatile memory that uses the default read thresholds is shown to increase over time (e.g., due to DR). The fast tracking method 200 reduces the BER and consequently prevents or postpones read retry events by identifying the BER behavior and tuning the read thresholds. In some examples in which the fast tracking is inactivated, the BER 210 increases until HB decoding capability constraint is violated and HB failure occurs. In some examples in which fast tracking is properly activated, each time BER 220 is high (and not high enough to cause HB decoding failure), read thresholds are tuned to significantly reduce the BER 220 to prevent HB decoding failure.

Some arrangements relate to random read fast tracking methods which can be implemented using HW/FW on a controller of a non-volatile memory device. The random read fast tracking methods described herein are simple, have low computational complexity, and are easy to integrate in a read flow. A random read fast tracking method described herein uses a single page read and FBC information, and no data buffers are needed. A random read fast tracking method described herein can be performed both during a functional read operation from host (e.g., in response to receiving a read command from the host) or in the background (e.g., without being in response to any specific read command from the host). The random read fast tracking methods described herein are suitable for any generation of NAND devices and do not depend on the NAND flash storage density. While some arrangements of the present disclosure are described relative to QLC, other types of non-volatile memory devices and setups/configurations thereof can likewise implement the random read fast tracking methods described herein.

Figures 3, 4, 5:
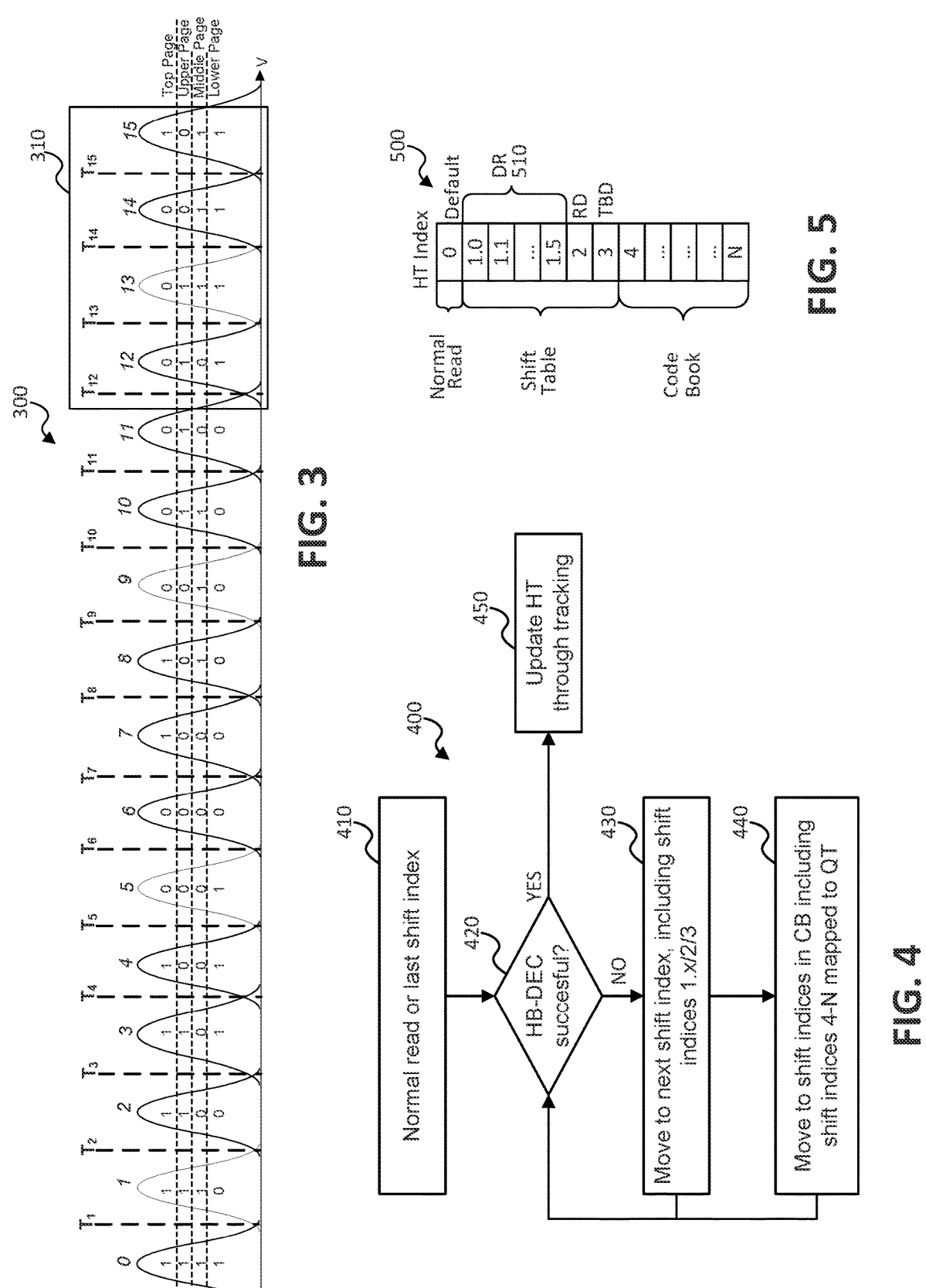
FIG. 3 is a graph illustrating example histograms of VT distribution, according to various arrangements.
FIG. 4 is a flowchart diagram illustrating an example read flow including DR tracking, according to various arrangements.
FIG. 5 is a diagram illustrating an example History Table (HT), according to various arrangements.

Some arrangements relate to fast random read tracking in view of DR. FIG. 3 is a graph illustrating example histograms 300 of VT distribution, according to various arrangements. The histograms 300 are similar to the histograms 100, and in case of DR, the lobes of the VT distribution in histograms 300 can become wider and drift to the negative voltage direction as compared to the histograms 100 which do not experience DR. Higher drift takes place in the higher states, e.g., the higher the DR the higher the drift. The VT distribution in FIG. 3 is depicted where the higher states most typically affected by DR are identified using the box 310. In some examples, test results of VT distribution of a single row demonstrate the states-shift when low DR VT distribution is compared to medium DR VT distribution. In a medium DR case, a high negative drift of the optimal read thresholds can be noticed in higher states (e.g., 12-15) within the box 310 and a small negative drift of the optimal read thresholds is noticed in the lower states (e.g., 0-11).

For example, T15 belongs to the top page and separates lobe 14 and lobe 15. In some examples, optimal T15 is highly affected by DR and, due to negative state drift, is expected that its FBC will be composed of rapidly increasing errors of one-to-zero errors (e.g., mistakenly reading bit "1" as "0") and slower increasing zero-to-one errors (e.g., mistakenly reading bit "0" as "1"). In addition, the overall FBC of T15 (and other thresholds FBC) will be noticeably higher as DR increases. T15 is part of the top page and thus, the top page read FBC information can be useful to determine if threshold tuning is needed. In some examples, in response to determining that the top page read FBC is higher than a predefined FBC value (e.g., an FBC threshold), and the ratio of one-to-zero errors to zero-to-one errors is higher than a predefined value (e.g., an error ratio threshold), the controller can determine to change the block read thresholds to different values. The updated block read threshold values can be determined based on offline optimization of a database containing blocks in various relevant conditions.

Some arrangements relate to the system architecture design for fast read thresholds tracking under DR stress. In the system architecture design, the tracking process has minimal or zero overhead without needing additional NAND reads, the tracking process can be performed based on functional reads or background (patrol-like) reads, the tracking process is based on directional FBC information of a single code-word, no histogram calculation or additional buffers are needed, the new read thresholds are selected based on simple calculations, and the tracking process can be implemented in HW/FW with no impact on read flow performance.

FIG. 4 is a flowchart diagram illustrating an example read flow 400 including DR tracking, according to various arrangements. FIG. 5 is a diagram illustrating an example History Table (HT) 500, according to various arrangements. The HT 500 can be used in the read flow 400. The read flow 400 can be performed by a controller of the non-volatile memory device and includes DR tracking up to or before the Quick Training (QT) stage. QT is an algorithm used to estimate read thresholds before an HB Decoding (HB-DEC) attempt and is typically close to the optimal read thresholds that are unknown in practical systems. An example of the QT algorithm is described in System and Methods Employing Mock Thresholds to Generate Actual Reading Thresholds in Flash Memory Devices, U.S. Pat. No. 8,751,726, filed on Sep. 17, 2008, the entire content of which is incorporated by reference in its entirety.

The HT 500 include entries, each of which is identified by a History Table (HT) index, shift index, or entry index. The entries of the HT 500 includes an entry with shift index [0] including at least one normal threshold. The entries of the HT 500 further includes shift tables with shift indices [1.0], [1.1], . . . , [1.5], [2], and [3], each of which includes at least one (e.g., 15) shift thresholds (relative to the normal threshold for shift index [0]) that are suitable to specific stress cases. The HT 500 includes additional shift indices, e.g., shift index [4], . . . , shift index [N] of the Code Book (CB) entries that are predetermined and are after QT operation, and a shift index closest to QT resulting read thresholds (based on evaluation of some metric) is selected.

The HT 500 includes multiple entries 510 that are preallocated for DR stress. Conventional HT may have limited entries for DR conditions, with index [1]. As shown, indices [1.X] represent shift read thresholds for gradually increasing DR conditions. In the read flow 400, HB-DEC is performed for each shift index 1x, 2, and 3 until the QT stage. In response to determining the HB-DEC is successful (420:

YES), tracking is performed to update the HT 500 at 450. The tracking and updating process 450 can update the block shift index after successful decoding with high BER, therefore prevent future decoding failures.

For example, at 410, a normal read using shift index [0] (e.g., a default shift index) or a read using the last shift index is performed. At 420, HB-DEC is applied. In response to determining that HB-DEC is unsuccessful or fails, the method 400 includes iteratively moving to a next shift index (e.g., 1x, 2, and 3) at 430 and determining whether HB-DEC is successful at 420. That is, in response to determining that HB-DEC fails at 420, at 430, the controller moves to the next shift index (e.g., shift index++) and performs HB-DEC.

For example, in response to determining that HB-DEC for shift index [0] fails at 420, at 430, the controller moves to the next shift index [1.0]. In HT 500, the next shift index [1.0] corresponds to stress 1.0, which is mapped to low DR. HB-DEC is applied for the next shift index [1.0] and fails at 420. In response to determining that the HB-DEC for the next shift index [1.0] fails, at 430, the controller moves to the next shift index [2] corresponding to stress 2, which is mapped to RD. HB-DEC is applied for the shift index [2] and fails at 420.

In response to determining that the HB-DEC for the shift index [2] fails, at 430, the controller moves to the next shift index [3] corresponding to stress 3, which is mapped to TBD. HB-DEC is applied for the shift index [3] and fails at 420. In response to determining that the HB-DEC for the shift index [3] fails, at 430, the controller applies QT, performs HB-DEC with QT thresholds, and updates the HT index accordingly under the assumption of HB-DEC success. The controller moves to the shift index (e.g., [4] to [N]) in CB, which is mapped to QT. The QT results can be used to change target block shift index accordingly.

For example, in response to determining that HB-DEC for shift index [1.0] succeeds at 420, the controller moves to the next shift index [1.1] corresponding to stress 1.1, which is mapped to low-medium DR, in case a decision rule condition holds. HB-DEC is applied for the shift index [1.1] In response to determining that HB-DEC for shift index [1.1] succeeds at 420, the controller moves to the next shift index [1.2] corresponding to stress 1.2, which is mapped to medium DR, in case a decision rule condition holds. HB-DEC is applied for the shift index [1.2]. In response to determining that HB-DEC for shift index [1.2] succeeds at 420, the controller moves to the next shift index [1.3] corresponding to stress 1.3, in case a decision rule condition holds, in the manner described, up to shift index [1.5] corresponding to stress 1.5, mapped to high stress. In response to determining that HB-DEC fails on any of [1.1]-[1.5], the controller moves to the next shift index [2].

Figure 6:
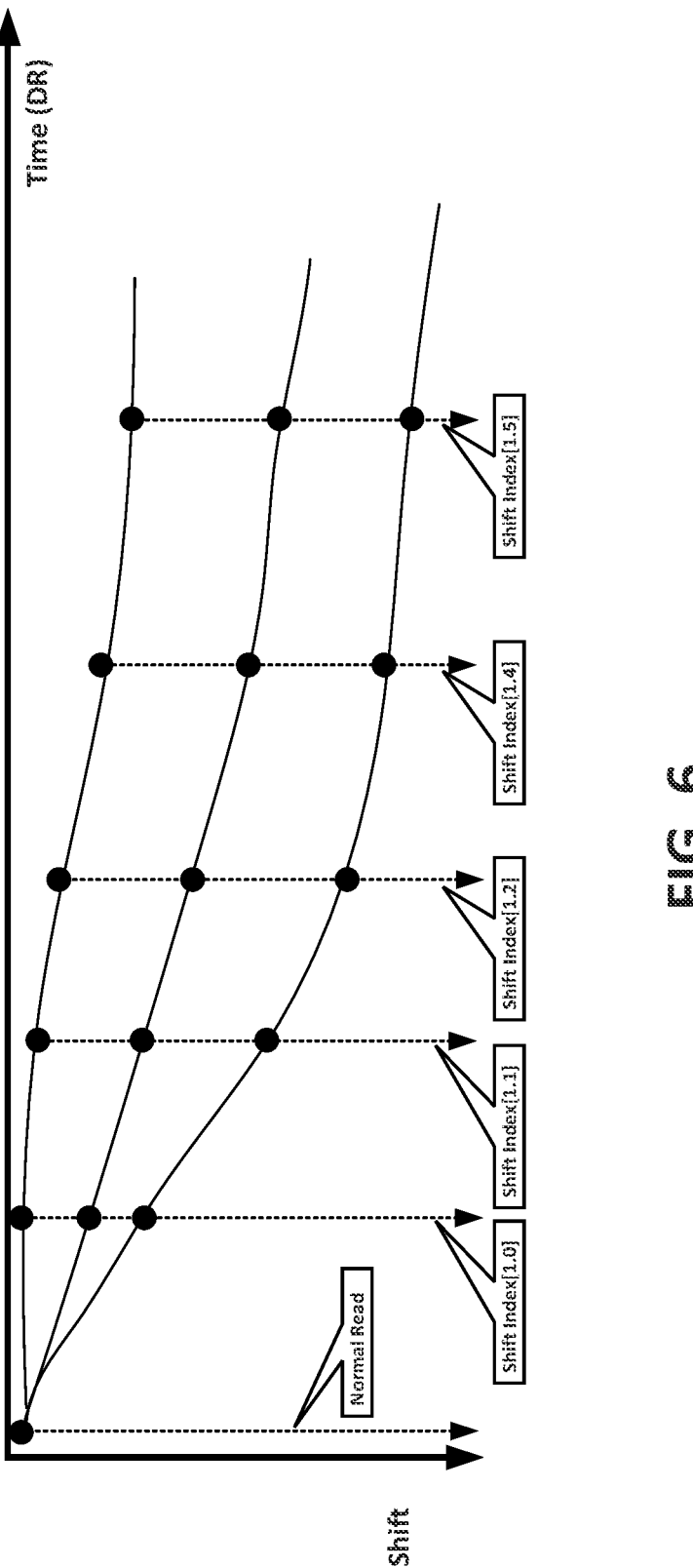
FIG. 6 is a graph illustrating shift indices for increasing DR conditions, according to various arrangements.

FIG. 6 is a graph illustrating shift indices for increasing DR conditions, according to various arrangements. As shown in FIG. 6, as DR increases (e.g., as retention time increases), the proper shifts in voltages become more negative due to lobes drift in the negative direction. For example, as compared to the normal read with shift index [0], the shift for shift index [1.0] is more negative, and the shifts for shift index [1.0]-[1.5] are successively more negative.

Figure 7:
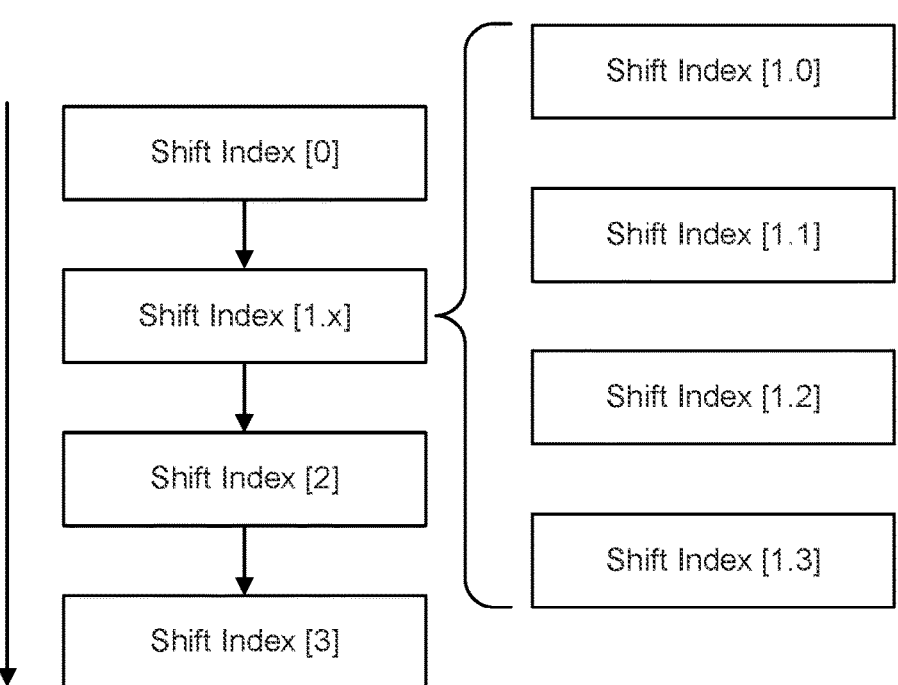
FIG. 7 is a diagram illustrating shift table phase and fast tracking, according to various arrangements.

FIG. 7 is a diagram illustrating shift table phase and fast tracking, according to various arrangements. As noted with reference to FIG. 5, in response to determining the HB-DEC is successful (420:YES), tracking is performed to update the HT 500 at 450. The order in which the shift index is used for HB-DEC (assuming HB-DEC fails on the current shift index) is shift index [0], shift index [1.x], shift index [2], shift index [3], before using the CB shift indices. The order in which the shift index is used for HB-DEC for DR 510 (assuming HB-DEC succeed on the current shift index) is shift index [1.0], shift index [1.1], shift index [1.2], shift index [1.3], shift index [1.4], and shift index [1.5]. Therefore, the overall order in which the shift index is possibly used for HB-DEC is shift index [0], shift index [1.0], shift index [1.1], shift index [1.2], shift index [1.3], shift index [1.4], shift index [1.5], shift index [2], shift index [3], before using the CB shift indices.

In some examples, shift indices 0, 1.0, 2, 3, 4, . . . N are referred to as first indices, and shift indices [1.X](e.g., [1.1], [1.2], . . . , [1.5]) are referred to as second indices. As described, the second indices represent shift read thresholds for increasing DR conditions gradually. In response to determining HB-DEC failure, read is performed from using a current shift index to a next closest first shift index (e.g., from 0 to 1.0, from 1.X to 2, from 2 to 3, and so on). In case of HB-DEC success and in case of high FBC count (e.g., the FBC count is higher than the FBC threshold), read is performed from using a current second shift index to a next closest second shift index (e.g., from 1.0 to 1.1, from 1.1 to 1.2, and so on). To reduce false-tracking, no shift index update is performed for a shift index with a low BER. That is, tracking can update the shift index in response to determining that a BER for the shift index that resulted in the successful HB-DEC is higher than BER threshold. In addition, hysteresis enables shift-back if needed. For example, in response to determining that the shift is determined due to noise, the shift updated may be reversed. In some examples, multiple page reads can be performed for decision making. In some examples, additional shift-table grid points can be considered.

Figure 8:
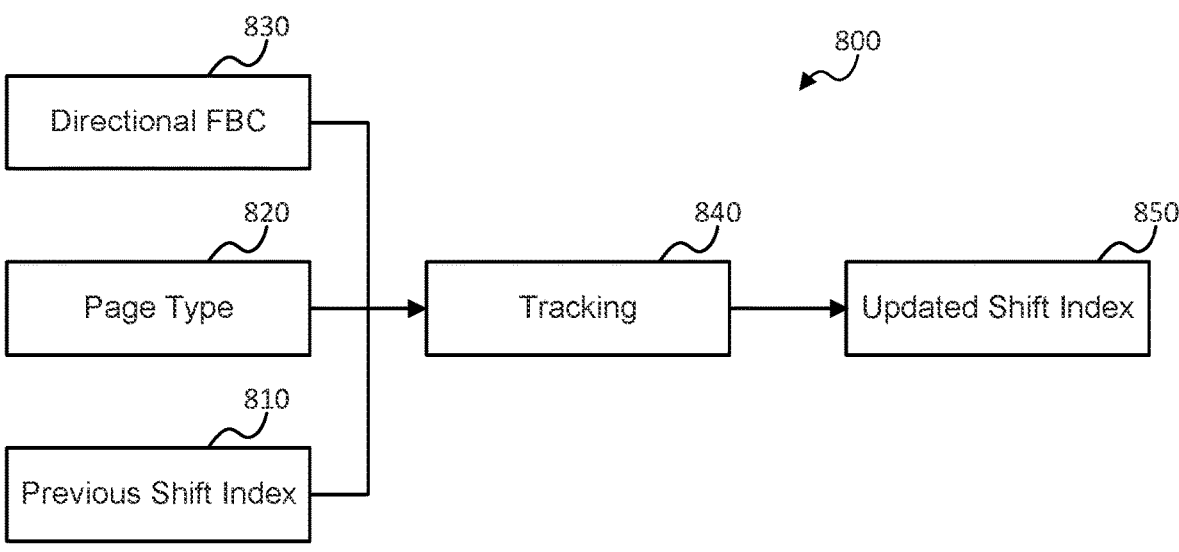
FIG. 8 is a diagram illustrating an example method for determining an updated shift index, according to various arrangements.

FIG. 8 is a diagram illustrating an example method 800 for determining an updated shift index, according to various arrangements. The tracking 840 in the method 800 can be implemented as an example of updating the HT 500 through tracking at 450. The inputs to the tracking 840 can include a previous shift-index 810, a page type 820, and directional FBC 830. The directional FBC 830 can include Error Correction Coding (ECC) results such as the FBC value and the direction of the errors e.g., a first direction such as erroneously reading "0" as "1" (zero-to-one error) or a second direction such as reading "1" as a "0" (one-to-zero error). The tracking output is the new or updated shift index 850. The updated shift index 850 can be equal to the previous shift-index in response to determining that the BER for the updated shift index 850 is no higher than a predetermined BER threshold, and can be different from the previous shift-index in response to determining that the BER for the updated shift index 850 is higher than the predetermined BER threshold. In some examples, additional system information (such as cycle count) can be used in order to improve accuracy in generating the updated shift index 850. In some examples, the page type 820 includes top page, upper page, middle page, or lower page.

In some implementations, due to DR, page FBC is expected to increase, and the lobes move in the negative direction. This results in the FBC in one direction, e.g., reading "1" as a "0" (one-to-zero) increasing faster than the other direction, e.g., reading "0" as a "1" (zero-to-one). The DR effect is much more noticeable in the higher states so it expected that the page including the last read threshold, T15, is the most sensitive to DR. In some examples, the top page includes T15. Thus, the page type (e.g., the top page) and directional FBC can be used to estimate the target block DR severity and select the appropriate shift index for this target block. In particular, if top page read FBC is higher than a predefined FBC value and the ratio of one-to-zero errors to zero-to-one errors is higher than a predefined value, the block read thresholds can be changed to the most suitable shift index read thresholds before HB decoding failure event occurs. A database of mapping based on prior knowledge can be stored in a memory of the controller, where the mapping is among a previous shift index, a page type, directional FBC information, and a corresponding output updated shift index.

In some examples, Meta Data (MD) such as page type 820, the previous shift index 810, and the cycle-count is available to the tracking estimator that implements the tracking 840. FW of the controller can be aware of the MD associated to the codeword in the ECC, which can be added to the HW data path.

Figure 9:
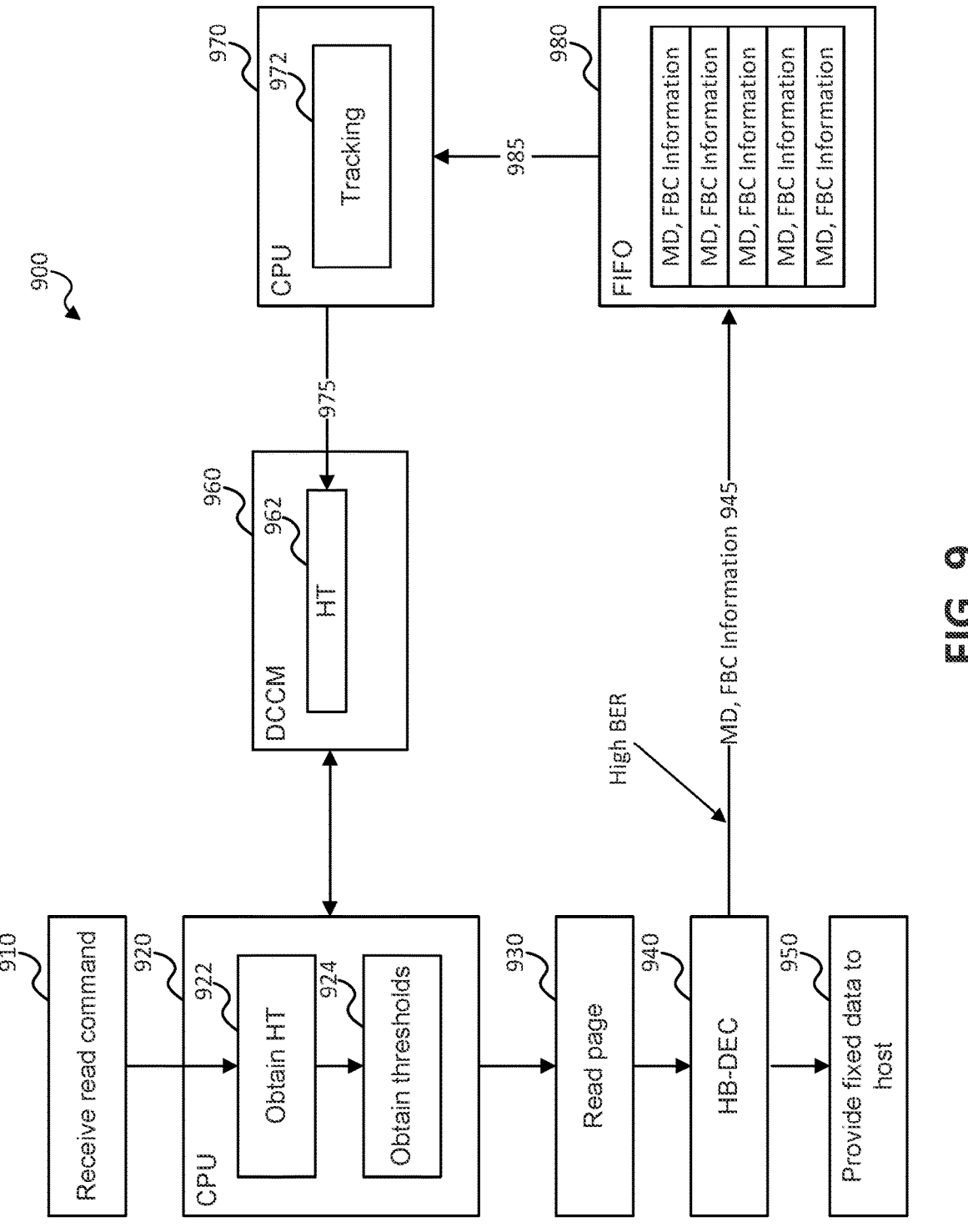
FIG. 9 is a diagram illustrating an example method for performing a read operation with fast tracking and HT table update, according to various arrangements.

FIG. 9 is a diagram illustrating an example method 900 for performing a read operation with fast tracking and HT table update, according to various arrangements. The method 900 can be performed by the controller of a non-volatile memory as configured by FW. The controller includes the CPU 920 and the CPU 970, which can be any processing circuit of the controller. In some examples, the CPUs 920 and 970 are separate HW processing circuits. In some examples, the CPUs 920 and 970 can be the same HW processing circuit. The controller further includes the Data Closely Coupled Memory (DCCM) 960, which can be a database implemented using any suitable memory in the controller. The controller further includes the First-In First-Out (FIFO) 980, which can be a part of a ECC module of the controller. The method 900 illustrates a system-level FW implementation of the fast tracking and HT table update.

At 910, the controller receives a read command from a host over a suitable host interface. The read command is provided to the CPU 920. Although in 910, read command (e.g., a functional read) from the host is used as an example, the read operation can also be a background or control-like read operation, or a read operation during a garbage collection process. At 922, the CPU 920 obtains an HT, such as the HT 500. For example, the FW can run a HT-GET procedure for the databases in DCCM 960 to retrieve the HT 962 from the DCCM 960. At 924, the CPU 920 extracts the shift indices from the HT 962. At 924, the CPU 920 obtains (e.g., extracts) a read threshold from one of the shift indices. At 930, the controller executes the read command and reads a page in the non-volatile memory using the read threshold obtained at 924. At 940, the controller performs HB-DEC on the read page. The controller can fix the data using any suitable ECC. At 950, the controller provides the fixed data back to the host in response to the read command, over the host interface.

In some examples, at 930, the controller can obtain MD when reading the page. In some examples, at 940, the controller can obtain FBC information while performing the HB DEC. At 945, the controller provides the MD and FBC information to the FIFO 980. The MD and FBC information are saved in the FIFO 980. In some examples, the current HT index for a page with low BER (e.g., the page BER being below a threshold) can remain without any updates, and in such cases, the MD and FBC information for that page do not need to be moved to the FIFO 980 in order to reduce storage and processing requirements. A pages with medium or high BER (e.g., the page BER being above the threshold) are tracking candidates, and the MD and FBC information for that page are moved to the FIFO 980 for tracking. The CPU 970 can read from the FIFO 980 at 985 and perform tracking 972. Examples of the tracking 972 includes the tracking methods 840 and HT update method 450. At 975, the CPU 970 updates the HT with the new shift index, which is the result of the tracking 972. For example, the shift index that resulted in HB-DEC success and BER above the threshold (and in some examples, satisfying other criteria) is updated in the HT as the default shift index [0]. In some examples, the updated shift index (and its corresponding threshold(s)) is for an entire block which includes the page read at 930. The CPU 970 does not become a bottleneck given that it reads data from the FIFO 980 when available. Thus, the fast tracking method described herein is simple for implementation.

For a subsequent read operation on a page on the block, a read threshold included in the updated shift index is used as the default threshold for the normal read (e.g., at 410). Thus, in other words, the controller applies read threshold included in the updated shift index for subsequently reading data stored on the page.

With respect to the increasing DR effect, the mean optimal threshold shift evaluated on a database of VT distributions illustrate that for the 15th threshold, T15, mean shift value is most affected as DR increases compared to the other thresholds, range of ~126 mV between minimum negative mean shift at low DR and maximum negative mean shift at high DR. Plotting the mean optimal FBC per threshold versus the increasing DR effect, with 8 DR cases illustrate that for all thresholds the FBC increases with the retention but for the higher state thresholds (e.g., T14 and T15), the increase is most dominant given that their corresponding lobes drift the most due to DR effect. T15 belongs to the top page in this evaluation, so the top page is expected to be significantly affected as DR increases. Normal reads are reads with normal thresholds, usually used in NAND start of life that may be highly inaccurate as DR increases. Plotting the mean normal read FBC per page versus the increasing DR effect illustrate that for all pages the FBC increases with the retention but for the top page that includes T15, the increase is most dominant (range of 1140 errors between low DR and high DR cases). Thus, top page FBC may be most informative for DR stress detection and proper threshold tuning.

In some implementations, the FBC is split into one-to-zero and zero-to-one errors, e.g., the FBC includes one-to-zero and zero-to-one errors. Given that DR shifts lobes in the negative direction, the errors are expected to be more dominant in one direction, e.g., one-to-zero errors, compared to the other direction, e.g., zero-to-one errors. This phenomenon is expected to be more dominant in the higher state thresholds, such as T15 that belongs to the top page. For example, for the top page, the one-to-zero errors increase much more rapidly (e.g., 836 mean error difference between lowest DR and highest DR) than zero-to-one errors (e.g., 304 mean error difference between lowest DR and highest DR). Therefore, the ratio between one-to-zero and zero-to-one errors in the top page is an informative feature to identify increasing DR stress and properly tune the read thresholds.

In some arrangements, a fast tracking algorithm for DR stress uses a database storing information for program disturb (RO), low DR (group A), and high DR (group B). For RO, the normal thresholds are typically appropriate. Based on offline database analysis, for low DR, shift thresholds in shift index [1.0] are appropriate that have negative values due to DR effect on VT distribution (negative lobes drift). For high DR, shift thresholds in shift index [1.1] are appropriate. The shift thresholds in shift index [1.1] are more negative than shift thresholds in shift index [1.0]due to higher negative lobes drift. The higher thresholds, e.g., T15, are affected more by DR compared to lower voltage thresholds.

In the fast tracking algorithm for DR stress, a known Cycle Count (CC) (e.g., 500) and known current shift thresholds are used. The top page FBC is obtained including one-to-zero and zero-to-one errors. Based on such feature, the controller determines whether to remain with the current shift index or to move to the next shift index. In the examples, the current shift index is 0, e.g., normal reads. The FBC value and a ratio of one-to-zero error to zero-to-one errors generally increase as DR becomes higher. In some arrangements, machine learning tools such as support vector machine or a simple neural network can be used to classify between RO and DR A based on the two input features: the FBC value and the ratio of one-to-zero error to zero-to-one errors.

In some examples, the controller reads RO blocks and evaluates the effect of true tracking decisions for this blocks (read with normal thresholds) and wrong tracking decisions for this blocks (read with shifts 1.0). In some examples, implementing the arrangements described herein, for both true tracking decision (e.g., read with normal thresholds) and wrong decisions (e.g., read with shift index 1.0) for test reading page FBC of RO blocks, the ECC capability constraint is not violated, which means that a wrong tracking decision in this case does not degrade read performance.

In some examples, DR A blocks are read and evaluated for the effect of true tracking decisions for this blocks (read with shifts 1.0) and wrong tracking decisions for this blocks (read with normal thresholds). For reading page FBC of DR A blocks with normal thresholds (wrong tracking decision, or no tracking capability, orange curve) and with shifts 1.0 (true tracking decision, yellow curve), in case tracking is not activated and normal reads are used the ECC capability constraint is violated and a considerable number of HB decoding failures may occur. In contrast, if tracking is activated and this DR A blocks are read with shifts 1.0, the ECC capability constraint is not violated, and HB-DEC failures are prevented.

In some examples, the FBC and one-to-zero and zero-to-one errors generally increase as DR becomes higher. In some examples, machine learning tools such as support vector machine or a simple neural network can be used to classify between DR A and DR B based on the two input features.

In some examples, DR A blocks are read and evaluated for the effect of true tracking decisions for this blocks (read with shifts 1.0) and wrong tracking decisions for this blocks (read with shifts 1.1 that fit DR B). In some examples, for both true and wrong decisions ECC capability constraint is not violated, and a wrong tracking decision in this case does not degrade read performance.

In some examples, DR B blocks are read and evaluated for the effect of true tracking decisions for this blocks (read with shifts 1.1) and wrong tracking decisions for this blocks (read with shifts 1.0). For reading page FBC of DR B blocks with shifts 1.0 (wrong tracking decision, orange curve) and with the more suitable shifts 1.1 (true tracking decision, yellow curve), in case tracking does not identify the high DR stress and shifts 1.0 are used, the ECC capability constraint is violated in much more cases than if tracking properly identifies the high DR stress and shifts 1.1 are used. Thus, accurate tracking decisions are used to maintain high read performance in this case, given that many HB decoding failures can be avoided.

In an experiment with 200,000 random reads from many different blocks, the read performance using the methods described herein can be evaluated in terms of latency Complementary Cumulative Distribution Function (CCDF) (e.g., in uS) where CCDF(Y) is the probability of the latency to be higher than Y and in terms of K Input-Output Operations Per Second (KIOPS) (e.g., in percentage) which is round(((cumulativeBW)/freshBW)*100). In some examples, freshBW is a fresh block KIOPS and an upper bound on NAND system IOPS performance. The cumulativeBW is the obtained KIOPS measured at 2000 reads snapshots and is a 100×1 vector. For a DR case from group A, a simple page FBC>145 tracking decision rule is used to decide whether to apply the updated/estimated read threshold (e.g., the second read threshold, including whether to change the block shift index from 0 (normal reads) to shifts 1.0. For example, the decision rule applies to any page type. The read flow simulated is based on a read flow described herein with normal reads (e.g., shift index 0), shift index 1.0, and QT stages. After QT stages, in case of HB decoding failure, soft decoding can be applied. The read flow is simulated with and without tracking. If tracking is not applied, a block can be changed from shift index 0 to shift index 1 only after HB decoding failure that induces high latency and degrades KIOPS performance. In contrast, if the fast tracking method as described herein is applied, a block can be moved from shift index [0] to shift index [1] based on FBC information before HB decoding failure occurs and therefore, can prevent failure in the target block. Consequently, read latency may be reduced and KIOPS performance may improve. The probability of high latency is lower when tracking is applied.

In some examples, KIOPS are presented versus the number of random reads with and without tracking where the goal is to reach 100%. Tracking increases the KIOPS and after the entire 200,000 reads, tracking KIOPS reaches 100%, while no tracking does not.

In some examples, the fast tracking accuracy can be improved by using multiple pages FBC (instead of a single page FBC) to make decision for updating the shift index. This approach requires sequential reads where the most accurate approach requires data buffering and histogram engines to accurately tune the block read threshold.

The fast sequential tracking can use only FBC but from multiple pages, and the fastest approach is to use single page FBC that may be noisy as compared to multiple sequential reads but can significantly improve performance compared to no tracking. In some examples, the multiple page fast tracking using FBC information is proposed such that the multiple page FBC information is combined to assess the stress of the target block and estimate or choose the appropriate read thresholds from a finite set of shift indices. The multiple page tracking can also include data buffering to generate read histograms. Such read histograms, used as input features for the tracker, can improve the thresholds estimation accuracy.

In some examples, statistics per random read command of same block can be saved. Recursive read thresholds update in which the read threshold estimator takes into account all historical statistics of the target block and the current page read result can be applied. The historical statistics manifests as a previous estimate, which is a sufficient statistic, such that the memory and computational complexity does not grow in time. In some examples, this operation can be implemented with a Kalman-type filter that may be based on Deep Neural Network (DNN), an example of which is described in G. Revach, et al., "KalmanNet: Neural Network Aided Kalman Filtering for Partially Known Dynamics," in IEEE Transactions on Signal Processing, vol. 70, pp. 1532-

1547, 2022, doi: 10.1109/TSP.2022.3158588). Such mechanism does not require strict model assumptions. The target of this tracker can be either continuous refinement of read thresholds from a finite set or direct estimation of the optimal read thresholds.

The methods described herein relative to DR can be likewise implemented for RD. With respect to fast random read tracking for RD, the lobes of the VT distribution become wider and drift to the positive direction. Higher drift takes place in the lower states and mainly in the erase lobe. The higher the RD the higher the drift. Therefore, T1 FBC is the most affected by increasing RD. For example, the lower page includes T1.

For example, by evaluating an increasing RD effect, mean shift value of the first threshold, T1 is most affected as RD increases compared to the other thresholds, range of −161 mV between minimum mean shift at low RD and maximum mean shift at high RD. T2 is affected as well, while T3-T15 are less affected by RD. By plotting the optimal threshold mean standard deviation versus the increasing RD cases, it can be observed that for T1, the mean std is relatively small compared to the mean shift values and therefore, the T1 mean shift values are reliable for understanding the shift thresholds statistical behavior as RD becomes more dominant. By plotting the mean optimal FBC per threshold versus the increasing RD effect, it can be observed that for all thresholds the FBC increases with the read disturb but for the lower state thresholds, T1 and T2, the increase is most dominant as their corresponding lobes drift the most due to RD effect.

Given that T1 belongs to the lower page, it is expected that the lower page is significantly affected as RD increases. Normal reads are reads with normal thresholds, usually used in NAND start of life that may be highly inaccurate as RD increases. By plotting the mean normal read FBC per page versus the increasing RD effect, it can be observed that for all page types the FBC usually increases with the read disturb but for the lower page that includes T1, the increase is most dominant (range of 342 errors between low RD and high RD cases). Thus, lower page FBC may be most informative for RD stress detection and proper threshold tuning.

In some examples, the FBC is split into one-to-zero and zero-to-one errors, and the FBC information includes one-to-zero errors and zero-to-one errors. Given that RD shifts lobes in the positive direction, the errors can be more dominant in one direction, e.g., one-to-zero errors, compared to the other direction, e.g., zero-to-one errors. This phenomenon is expected to be more dominant in the lower state thresholds, such as T1 that belongs to the lower page. In the lower page, the one-to-zero errors increase much more rapidly (e.g., 317 mean error difference between low RD and high RD) than zero-to-one errors (e.g., 29 mean error difference between low RD and high RD). Consequently, the ratio between one-to-zero and zero-to-one errors in the lower page is an informative feature to identify increasing RD stress and properly tune the read thresholds.

In some examples, for a fast tracking algorithm for RD stress, the database can be split into two groups including no/low RD (RD 0) and high RD (group A). For RD 0, the normal thresholds are usually appropriate. Based on offline database analysis, for high RD, shift thresholds in shift index [1.0], where T1 and T2 shift thresholds in shift index [1.0] are in the positive direction due to significant positive lower states drift. The shift index [1.0] of T1 is highest given that erase lobe is most affected by increasing RD resulting in erase penetration and increased T1 FBC. In the methods described herein, a known CC (e.g., 500) and known current shift thresholds are used, and that lower page FBC is obtained including one-to-zero and zero-to-one errors. Based on such features, whether to remain with the current shift index (shift index [0]) or to move to the next shift index [1.0] is determined. First, the current shift index [0](e.g., normal reads) is used. The FBC and the ratio of one-to-zero errors to zero-to-one errors generally increase as RD becomes higher. In some examples, machine learning tools such as support vector machine or a simple neural network can be used to classify between RD 0 and RD A based on the two input features.

In some examples, RD 0 blocks are read and evaluated for the effect of true tracking decisions for this blocks (read with normal thresholds) and wrong tracking decisions for this blocks (read with shifts 1.0)

By evaluating page FBC of RD 0 blocks read with normal thresholds (true tracking decision, orange curve) and read with shifts 1.0 (wrong tracking decision, yellow curve), for true decision, ECC capability constraint is not violated and for wrong decision, ECC capability constraint is violated in very few lower page cases. Accordingly, a wrong tracking decision in this case causes almost no read performance degradation.

In some examples, RD A blocks are read and evaluated for the effect of true tracking decisions for this blocks (read with shifts 1.0) and wrong tracking decisions or no tracking capability for this blocks (read with normal thresholds). In some examples, in case tracking is not activated and normal reads are used, the ECC capability constraint is violated in many pages and thus, many HB decoding failures may occur. In contrast, if tracking is activated and this RD A blocks are read with shifts 1.0, the ECC capability constraint is not violated, except for very few cases, so many HB decoding failures can be prevented.

Figure 10:
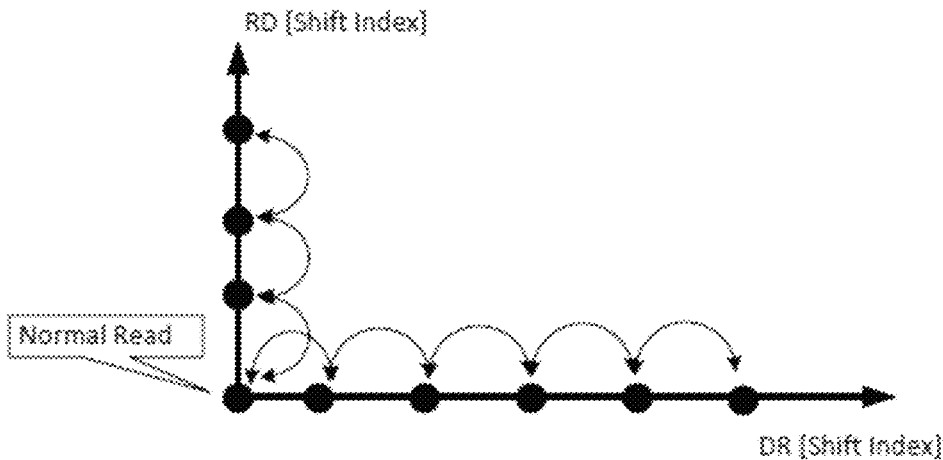
FIG. 10 is a graph illustrating an example multi-stress and multi-directional tracking, according to various arrangements.

FIG. 10 is a graph illustrating an example multi-stress and multi-directional tracking, according to various arrangements. For example, the methods described herein can be used for multiple stress types such as DR and RD and multiple directions. As shown, tracking decisions can be made to change the shift index in a DR direction (e.g., the horizontal axis) or an RD direction (e.g., the vertical axis). In addition, "wrong" tracking decisions, such as DR misidentified as RD, can be corrected by shifting back to origin point.

In some examples, accurate FBC information is available after successful decoding. In the examples in which after decoding failure, fast tracking is still applied, the FBC information can still be used but should be considered as inaccurate for the fast tracking method. In some examples, partial FBC information can be extracted despite decoding failure.

In some examples, the error vector information that is used for tracking can be efficiently used by the tracking estimator even if this error vector is not fully accurate, given that the tracking process is based on statistical information. In some code structures (e.g., Bose-Chaudhuri-Hocquenghem (BCH) codes), in case of decoding failure, there is no information about the error vector so FBC information is not available. In contrast, in other code structures, such as in product code, the code structure is based on multiple code components. In this case, during the decoding process, the code components are solved iteratively. In case that all code components are solved successfully, the decoding is finished successfully and the error vector (all errors in the original code word) is available. In case of decoding failure, some code components were not decoded successfully. However, in case that some or most of the code components were decoded successfully (number of unsolved code components is less than a threshold), then most of the errors in the original code word are available and this information may be sufficient to provide accurate tracking.

Figure 11:
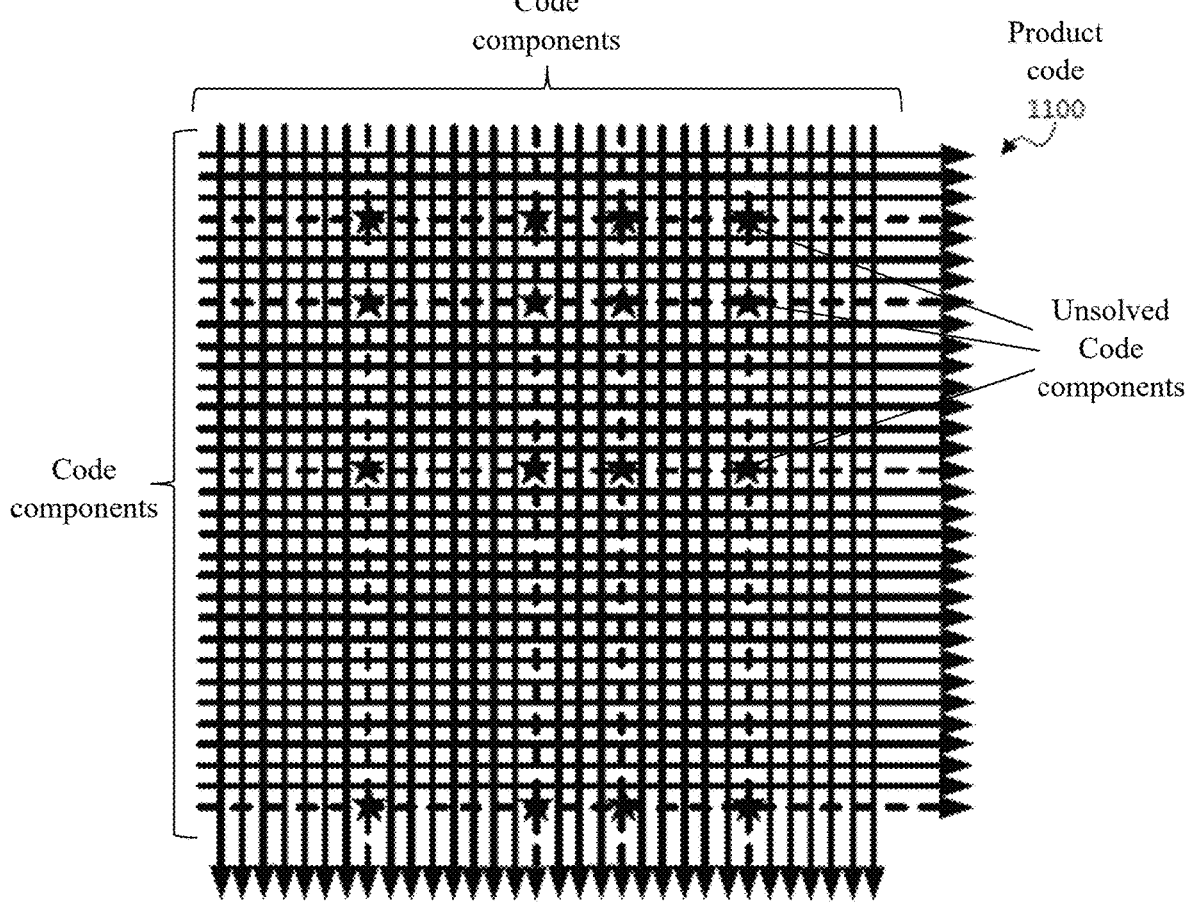
FIG. 11 is a diagram illustrating an example product code used to obtain suboptimal error vector under decoding failure, according to various arrangements.

FIG. 11 is a diagram illustrating an example product code 1100 used to obtain suboptimal error vector under decoding failure, according to various arrangements. The product code 1100 can be used for providing partial FBC information. For example, the original code word is made of 32×32 code components with overall 64 code components. Each code component can fix t=3 errors. In some examples, during the iterative decoding, many errors (above a suitable threshold) were fixed on the code components represented by black lines. In the stopping set, there are 16 errors (marked with stars) that cannot be solved using turbo decoding. As a result, decoder result is "decoding failure" with 8 unsolved code components (dashed lines). The errors vector information from the code components that were fixed with high probability, which are represented by the black lines, is available and may be good enough for the tracking process.

In some arrangements, the fast tracking methods described herein can derive sufficiently accurate suboptimal read thresholds that correspond to specific stress condition using offline optimization. For example, different shift read threshold tables can be prepared for increasing DR conditions, where shift read threshold are read threshold voltages relative to normal read thresholds set during manufacturing and serve as zero shifts. The first read thresholds in the HT can correspond to low DR, the second read thresholds in the table can correspond to medium DR, and so on.

In some examples, the fast tracking method includes performing a single page read operation (e.g., specific to a page type) and decoding the read data. Directional page FBC information, which includes overall number of page errors as well as their directions can be extracted. Page FBC information can be extracted in case of successful decoding. If decoding failure occurs, the fast tracking can be applied using partial FBC information.

The fast tracking method uses the FBC information to identify if the block is under specific stress, e.g., DR or RD, and determine whether to change the currently used read thresholds to more suitable and accurate read thresholds for future reads from the target block. Using more accurate read thresholds when needed can significantly reduce BER and improve overall system performance, where in case of random reads the IOPS metric is usually used. The single page fast tracking method is simple with low latency and memory constraints. Robust fast tracking method may handle several types of stresses, e.g., both DR and RD.

Read thresholds estimation and tracking can be used from multiple random read results of same block (e.g., read from multiple rows and multiple pages of same block). The multiple page reads can be used to either estimate thresholds directly (e.g., by using a DNN). In some examples, all statistics can be used to classify the best read thresholds of the target block from a finite set of classes.

In some examples, decoding statistics per read command of same block can be stored over time. Recursive read thresholds can take into account all historical statistics of same block and the current read result. This can be implemented with a Kalman filter solution. The target may be either continuous refinement of read thresholds from a finite set or actual thresholds estimation.

Figure 12:
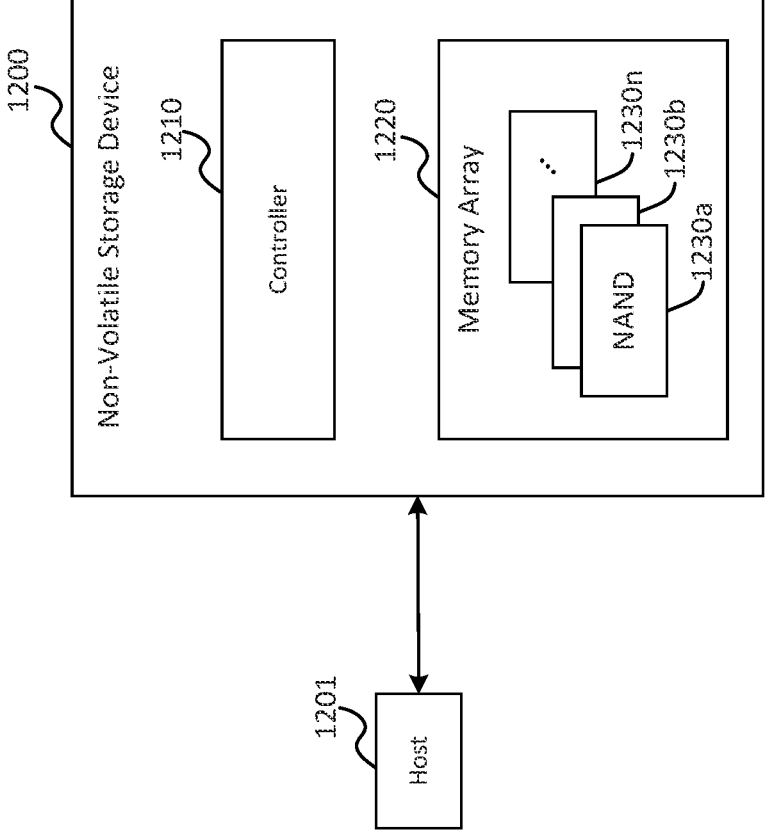
FIG. 12 is a block diagram illustrating a non-volatile storage device, according to some arrangements.

To assist in illustrating the present implementations, FIG. 12 shows a block diagram of a system including a nonvolatile storage device 1200 coupled to a host 1201 according to some implementations. In some examples, the host 1201 can be a user device operated by a user. The host 1201 may include an operating system (OS), which is configured to provision a filesystem and applications which use the filesystem. The filesystem communicates with the non-volatile storage device 1200 (e.g., a controller 1210 of the non-volatile storage device 1200) over a suitable wired or wireless communication link or network to manage storage of data in the non-volatile storage device 1200. In that regard, the filesystem of the host 1201 sends data to and receives data from the non-volatile storage device 1200 using a suitable interface to the communication link or network.

In some examples, the non-volatile storage device 1200 is located in a datacenter (not shown for brevity). The datacenter may include one or more platforms, each of which supports one or more storage devices (such as but not limited to, the non-volatile storage device 1200). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 1200 include but are not limited to, a solid state drive (SSD), a non-volatile dual in-line memory module (NVDIMM), a Universal Flash Storage (UFS), a Secure Digital (SD) device, and so on.

The non-volatile storage device 1200 includes at least a controller 1210 and a memory array 1220. Other components of the non-volatile storage device 1200 are not shown for brevity. The memory array 1220 includes NAND flash memory devices 1230a-1230n. Each of the NAND flash memory devices 1230a-1230n includes one or more individual NAND flash dies, which are non-volatile memory capable of retaining data without power. Thus, the NAND flash memory devices 1230a-1230n refer to multiple NAND flash memory devices or dies within the flash memory device 100. Each of the NAND flash memory devices 1230a-1230n includes one or more dies, each of which has one or more planes. Each plane has multiple blocks, and each block has multiple pages.

While the NAND flash memory devices 1230a-1230n are shown to be examples of the memory array 1220, other examples of non-volatile memory technologies for implementing the memory array 1220 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 1210 include but are not limited to, an SSD controller (e.g., a client SSD controller, a datacenter SSD controller, an enterprise SSD controller, and so on), a UFS controller, or an SD controller, and so on. The controller 1210 can combine raw data storage in the plurality of NAND flash memory devices 1230a-1230n such that those NAND flash memory devices 1230a-1230n function as a single storage. The controller 1210 can include microcontrollers, buffers, error correction systems, Flash Translation Layer (FTL) and flash interface modules. As described herein, the controller 1210 can further include the CPU 920, the CPU 970, the FIFO 980, and the DCCM 960.

Such functions can be implemented in HW, Software (SW), and FW or any combination thereof. In some arrangements, the SW/FW of the controller 1210 can be stored in the non-volatile storage device 1200 or in any other suitable computer readable storage medium.

The controller 1210 includes suitable processing and memory capabilities for executing functions described herein, among other functions. As described, the controller 1210 manages various features for the NAND flash memory devices 1230a-1230n including, but not limited to, I/O handling, reading, writing/programming, erasing, monitoring, logging, error handling, garbage collection, wear leveling, logical to physical address mapping, data protection (encryption/decryption), and the like. Thus, the controller 1210 provides visibility to the NAND flash memory devices 1230a-1230n.

The error correction systems of the controller 1210 can include or otherwise implement one or more ECC encoders and one or more ECC decoders, collectively referred to as an ECC encoder/decoder. The ECC encoders are configured to encode data (e.g., input payload) to be programmed to the non-volatile storage 120 (e.g., to the NAND flash memory devices 1230a-1230n) using the ECC structures described herein. The ECC decoders are configured to decode the encoded data to correct programming errors, errors caused by reading with non-optimal thresholds, errors caused by retention/read-disturb stresses, and so on, in connection with a read operation. To enable low-complexity processing, the ECC encoder/decoder is implemented on hardware and/or firmware of the controller 1210.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A system, comprising:
   a non-volatile memory; and
   a controller operatively coupled to the non-volatile memory, wherein the controller is to:
      determine information on a number of errors for a page of the non-volatile memory that occur while reading data stored in the page, wherein the data is read using a first read threshold;
      determine a second read threshold based at least in part on the first read threshold and the information on the number of errors for the page; and
      apply the second read threshold for subsequently reading data stored on the page according to a decision rule.

2. The system of claim 1, wherein reading the data comprises a single page read operation on the page of the non-volatile memory.

3. The system of claim 1, wherein the information on the number of the errors for the page comprises a Failed Bit Count (FBC) value and a direction of the errors.

4. The system of claim 3, wherein the direction of the errors comprises:
   a first direction corresponding to reading "0" as "1" or a zero-to-one error; and
   a second direction corresponding to reading "1" as a "0" or a one-to-zero error.

5. The system of claim 3, wherein the controller is to determine the second read threshold in response to determining that:
   the FBC value is higher than an FBC threshold;
   a ratio of the second direction of errors to the first direction of errors is higher than an error ratio threshold.

6. The system of claim 1, wherein the information on the number of errors for the page comprises an actual number of errors for a given size of the page.

7. The system of claim 1, wherein the second read threshold is determined based at least in part on the first read threshold, the information on the number of errors for the page, and a page type.

8. The system of claim 1, wherein the page type comprises at least one of a top page, upper page, middle page, or lower page.

9. The system of claim 1, wherein the first read threshold corresponds to a first shift index, and the second read threshold corresponds to a second shift index.

10. The system of claim 9, wherein the controller is to:

perform hard bit decoding (HB-DEC) for the first shift index;

determine that the HB-DEC fails for the first shift index;

perform the HB-DEC for the second shift index;

determine that the HB-DEC succeeds for the first shift index; and update a History Table (HT) using the second shift index according to the decision rule.

11. The system of claim 10, wherein the HT is updated using the second shift index in response to determining that a Bit Error Rate (BER) for the second shift index is greater than a BER threshold.

12. The system of claim 10, wherein updating the HT comprises replacing a default shift index of the HT with the second shift index.

13. The system of claim 10, wherein the HT comprises a plurality of shift indices corresponding to Data Retention (DR).

14. The system of claim 9, wherein the first shift index comprises at least one read threshold comprising the first read threshold; and the second shift index comprises at least one read threshold comprising the second read threshold.

15. The system of claim 1, wherein the controller is to:

store the information on the number of errors for the page and Meta Data (MD) in a First-In First Out (FIFO); and retrieve the information on the number of errors for the page and the MD to determine the second read threshold.

16. The system of claim 15, wherein the MD comprises at least one of a page type, a previous shift index, and a cycle count.

17. At least one non-transitory computer readable medium including one or more instructions stored thereon and executable by a processor to:

determine information on a number of errors for a page of the non-volatile memory that occur while reading data stored in the page, wherein the data is read using a first read threshold;

determine a second read threshold based at least in part on the first read threshold and the information on the number of page errors for the page; and apply the second read threshold for subsequently reading data stored on the page according to a decision rule.

18. The at least one non-transitory computer readable medium of claim 17, wherein the information on the number of the errors for the page comprises a Failed Bit Count (FBC) value and a direction of the errors; and the direction of the errors comprises:

a first direction corresponding to reading "0" as "1" or a zero-to-one error; and a second direction corresponding to reading "1" as a "0" or a one-to-zero error.

19. A method, comprising:

determining information on a number of errors for a page of the non-volatile memory that occur while reading data stored in the page, wherein the data is read using a first read threshold;

determining a second read threshold based at least in part on the first read threshold and the information on the number of page errors for the page; and applying the second read threshold for subsequently reading data stored on the page according to a decision rule.

20. The method of claim 19, wherein the information on the number of the errors for the page comprises a Failed Bit Count (FBC) value and a direction of the errors; and the direction of the errors comprises:

a first direction corresponding to reading "0" as "1" or a zero-to-one error; and a second direction corresponding to reading "1" as a "0" or a one-to-zero error.

* * * * *